United States Patent [19]

Hsu

[11] 3,996,577
[45] Dec. 7, 1976

[54] METHOD AND APPARATUS FOR THE CONTROLLED GENERATION OF WALL-ENCODED MAGNETIC BUBBLE DOMAINS

[75] Inventor: Ta-lin Hsu, San Jose, Calif.

[73] Assignee: International Business Machines Corporation, Armonk, N.Y.

[22] Filed: Oct. 25, 1974

[21] Appl. No.: 517,997

Related U.S. Application Data

[63] Continuation-in-part of Ser. No. 492,565, July 29, 1974, abandoned.

[52] U.S. Cl. .................. 340/174 TF; 340/174 EB; 340/174 VA
[51] Int. Cl.[2] ...................................... G11C 11/14
[58] Field of Search ............... 340/174 TF, 174 SR

[56] References Cited

UNITED STATES PATENTS

| | | | |
|---|---|---|---|
| 3,662,359 | 5/1972 | Genovese | 340/174 TF |
| 3,899,779 | 8/1975 | Malozemoff | 340/174 TF |
| 3,930,243 | 12/1975 | Hsu et al. | 340/174 TF |

OTHER PUBLICATIONS

IBM Technical Disclosure Bulletin–vol. 17, No. 5, Oct. 1974, p. 1485.
Appl. Phys. Lett. "Suppression of Hard Bubbles by a Thin Permalloy Layer" by Lin et al.; vol. 22, No. 11 6/73, pp. 603, 604.
Bell System Tech. Journal "A New Type of Cyl. Magnetic Domain" by Tabor et al.; vol. 51, No. 6, July–Aug. 1972, pp. 1427–1430.
Amer. Inst. of Phys.; AIP Conf. Proc.; "Bubble Lattices" by Je Jonge et al.; No. 5, Part 1; 11/16–19/1971.

*Primary Examiner*—James W. Moffitt
*Attorney, Agent, or Firm*—Joseph E. Kieninger

[57] ABSTRACT

A magnetic layer is exchange coupled to a bubble medium in an area where bubble domains are nucleated, and is used together with or without an externally applied in-plane magnetic field to controllably generate bubble domains with either one pair ($S = 0$) or no Bloch lines ($S = 1$), respectively. The exchange coupled magnetic layer can be either an ion-implanted layer, a thin garnet film with planar magnetization, or a thin permalloy film. The exchange coupled magnetic layer may be positioned either on top of or below the bubble film used for storage. An information store utilizing domain interaction for bubble domain storage such as lattice array is accomplished by having each bubble domain representing either binary bit according to its domain wall state. The controlled switching of bubble domain wall states from any state to either one of two known states can be achieved by subjecting the wall of the bubble domain to a critical velocity, depending upon the application or not of the external in-plane magnetic field to the exchange coupled magnetic layer.

16 Claims, 14 Drawing Figures

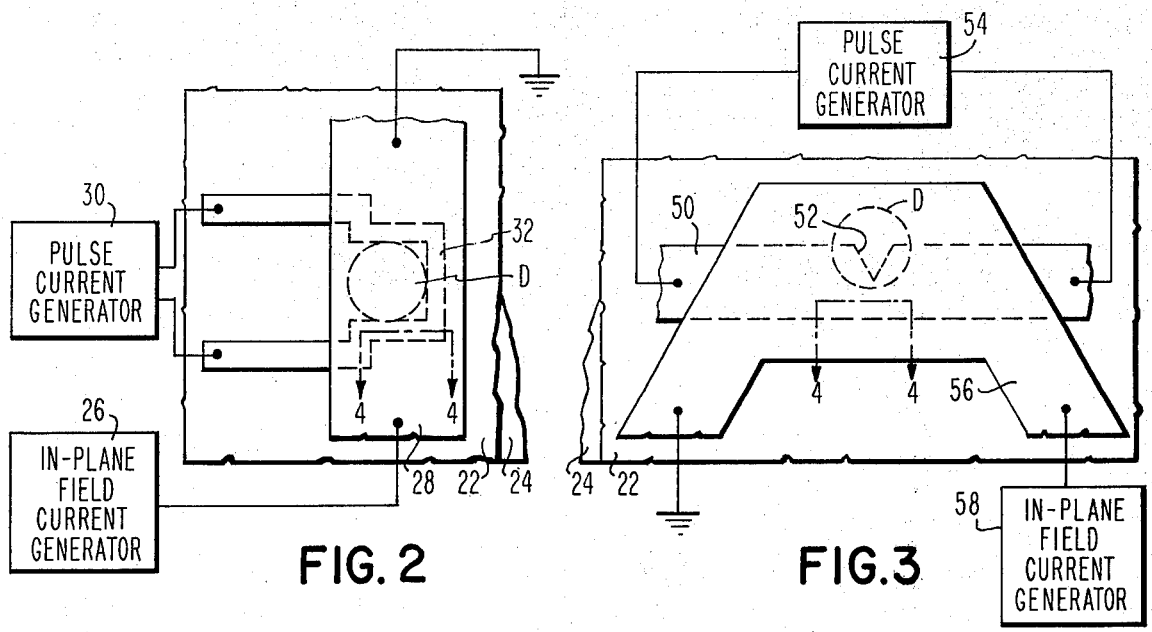
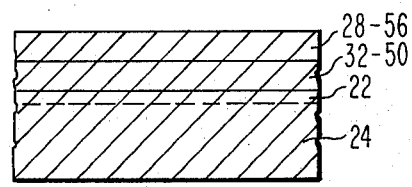
FIG.4
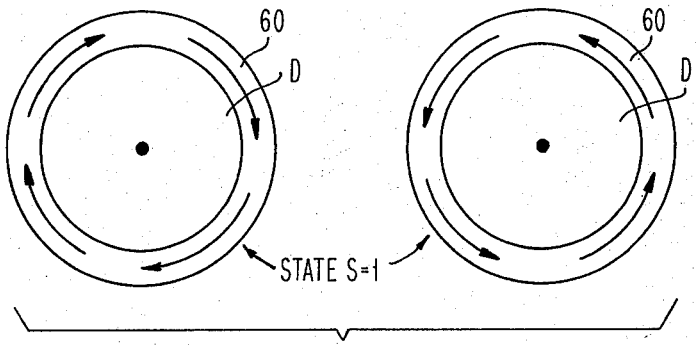
FIG.5A
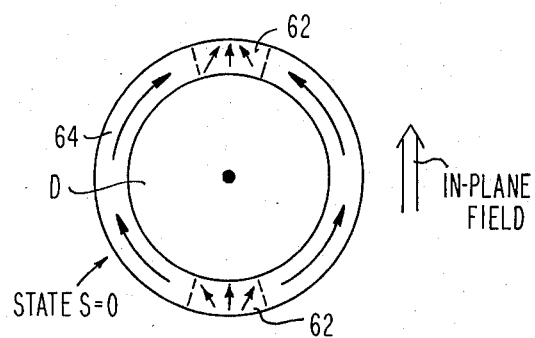
FIG.5B

METHOD AND APPARATUS FOR THE CONTROLLED GENERATION OF WALL-ENCODED MAGNETIC BUBBLE DOMAINS

The present application is a continuation-in-part of co-pending application Ser. No. 492,565 filed July 29, 1974 now abandoned.

BACKGROUND OF THE INVENTION

The invention relates generally to information storage devices and, more particularly, to thin film magnetic domain devices.

1. Field of the Invention

A single wall or bubble domain for the present invention is defined as a magnetic domain bounded by a domain wall which closes on itself in the plane of a host magnetic medium and has a geometry independent of the boundaries of a sheet of the medium in the plane in which it is moved. The term bubble domain includes circular wall-shaped domains, elongated circular or stripe domains, and segment domains where a portion of the domain boundary is completed by a magnetic discontinuity such as a boundary of the sheet. Inasmuch as a bubble domain is self-defined in a plane of movement, it is free to move in two dimensions and such a plane is now well known. The movement of domains is normally performed by generating a localized field gradient within the host magnetic medium in the desired direction.

Materials which are well known in the art for their ability to support bubble domains are rare earth orthoferrites and garnets. These materials have preferred directions of magnetization substantially normal to the plane of the sheet. A bubble domain, in a material of this type, is magnetized in one direction along its axis whereas the remainder of a sheet is magnetized in the opposite direction, the domain appearing as a dipole oriented normal to the plane of the sheet. Other magnetic materials may be used as bubble domain carriers so long as the magnetic material is anisotropic with the easy axis of magnetization normal to the plane of the sheet.

A confined array such as the lattice array of bubble domain elements can be formed by confining a plurality of bubble domains while providing accessing means to enter and remove bubble domains into and out of the confined array. The bubble domains themselves store the necessary data information. Since each bubble domain itself stores the required data, the bubble domain can be placed close together and confined. The interaction forces between domains stabilize their position within the lattice array. The lattice array is, therefore, an efficient information storage device. Reference is made to a co-pending U.S. patent application, Ser. No. 395,336, filed on Sept. 7, 1973 now abandoned and assigned to the assignee of the present invention, for a complete description of a lattice array of interactive elements.

2. Description of the Prior Art

In most of the prior art information storage systems using single-wall magnetic domains, data bits were generally represented as the presence and absence of bubble domains. This method was used initially in the development of magnetic domain systems since the nucleation or splitting of bubble domains or not at will was perhaps the easiest method of adapting the technology to a practical use.

Different domain properties useful for storage of information and the retrieval thereof were then discovered. In a co-pending U.S. Pat. No. 3,911,411, filed on Dec. 29, 1972 and assigned to the same assignee as the present invention, domains having different apparent sizes are used to represent different information states. Another bubble domain property useful for storing information is that the magnetization in the wall of the domain can have different directions of rotation or chirality. The different directions of the rotation of the domain wall magnetization can be used as a binary representation of data. A publication by George Henry in the IBM Technical Disclosure Bulletin, Vol. 13, No. 10, p. 3021, March 1971, discloses the adaptation of chirality to the bubble domain apparatus.

In the work being performed on magnetic bubble domains, it was discovered that magnetic domains have other dissimilar properties which serve to distinguish one from another. It was discovered that domains can have different numbers of vertical Bloch lines which may roughly be thought of as a vertical line of twist in the wall magnetization. These Bloch lines separate two areas within the domain wall magnetization. It was further found that these different domains have different directions of movement in an applied gradient magnetic field.

The phenomena of the Bloch line was noted in a co-pending U.S. Pat. No. 3,940,750, filed on Mar. 26, 1973, and assigned to the assignee of the present invention. Since the discovery of the Bloch lines, there have been many articles discussing their properties including an article by A. P. Malozemoff, in Applied Physics Letters 21, p. 149 (1972) where it was shown that if there are enough vertical Bloch lines inside the domain wall, then the domain will collapse at a higher bias field than one with a smaller number of vertical Bloch lines. In additions, the diameter and mobility may be different depending on the number of vertical Bloch lines.

A utilization of these different types of magnetic bubble domains was included in a co-pending U.S. Pat. No. 3,890,605, filed on June 29, 1973, and assigned to the assignee of the present invention. The important property of different angles of deflection of the bubble domains in a gradient magnetic field according to the wall topology or state of the domain was recognized and disclosed therein. The angle of deflection was disclosed as a function of the number of rotations of wall magnetization around a peripheral of the domain the wall and was used to represent data in an information store. However, the generation of the bubble domains was essentially haphazard in that a multiplicity of domains were generated without regard for their properties. These domains were first sensed according to their deflection angle and then stored in a data bit bin according to the deflection angle sensed. A particular bit bin was then actuated to release a domain according to the data state required for storage into the information storage system. Only the propagation deflection trait of the different domains were known at that time. One domain when propagated in a common field gradient could deflect at a different angle from another domain. However, the controlled generation of domains having selected wall states was not known.

Accordingly, it is an object of the present invention to provide a magnetic domain arrangement having controlled generation of wall states of bubble domains.

It is a further object of this invention to provide a method for the controlled generation of wall-encoded bubble domains.

Another object of this invention is to provide a method and apparatus to predictably switch the wall state of a bubble domain from an unknown state to a known state.

Yet another object is to provide an information storage device which utilizes two states of the magnetic bubble domain wall for binary data storage.

The use of a second magnetic layer on a bubble medium and its effect on the apparent elimination of "hard" bubble domains is given in an article entitled *The Effect of a Second Magnetic Layer on Hard Bubble*, by A. Rosencwaig, appearing in the Bell System Technical Journal, Vol. 51, pp. 1440–1444, July–August 1972. The purpose of the article was to eliminate the problem which developed because all bubble domains did not propagate in an orderly fashion. The second or capping layer without a unipolar in-plane field, according to this article, reduced the number of Bloch lines to one pair. This was found to be incorrect by may experiments.

it is therefore another object to provide a method and apparatus for controllably generating bubble domains of two known wall states in a bubble medium having a second magnetic layer.

These and other objects of the present invention will become apparent to those skilled in the art as the description proceeds.

SUMMARY OF THE INVENTION

The apparatus according to the present invention for the controlled generation of bubble domains of two predetermined states in a bubble medium supporting bubble domains comprises a magnetic layer having an in-plane magnetization exchange coupled to the bubble medium with nucleating means associated with either the bubble medium or the exchange coupled magnetic layer. Without an in-plane magnetic field being applied to the exchange coupled magnetic layer, the bubble domains nucleated have no Bloch lines $S = 1$ in its domain wall. With an in-plane magnetic field applied to the exchange coupled layer, the bubble domains nucleated have one pair of Bloch lines $S = 0$.

The method of controllably generating bubble domains having two predetermined states comprises exchange coupling a planar magnetic layer to a medium supporting bubble domain. An in-plane field is applied or not to the exchange coupled magnetic layer. As a practical matter, the in-plane field is applied to the bubble medium as well as the exchange coupled magnetic layer and this, in fact, may play a role in the state controlling mechanism. The application or not of the in-plane field while nucleating a bubble domain determines the state of the nucleated bubble domain.

Apparatus for the controlled switching of bubble domains from an unknown state to a known state in a bubble medium supporting bubble domains comprises a layer having an in-plane magnetization applied thereto and exchange coupled to the bubble medium together with means for subjecting the bubble domains to a wall motion to actuate interaction of the wall magnetization with that of the exchange coupled magnetic layer. The application of the wall motion to the bubble domains without an in-plane magnetic field being applied to the exchange coupled magnetic layer results in bubble domains having no Bloch lines in their domain wall, that is, a state $S = 1$, regardless of the state of the bubble domains prior to the applied motion. If an in-plane magnetic field is applied to the exchange coupled magnetic layer, the bubble domains having an unknown state will all become bubble domains having one pair of Bloch lines, that is, a state $S = 0$, when subjected to the wall motion.

The method for forming a series of bubble domains representing data by controllably switching a bubble domain from an unknown to known wall state comprises exchange coupling an exchange coupled magnetic layer having an in-plane magnetization to an area of a medium supporting bubble domains. Bubble domains are then inserted into the bubble medium associated with the exchange coupled magnetic layer area. The inserted bubble domains are then subjected to a wall motion of sufficient velocity to cause a change in the Bloch line structure of the bubble domain wall. An in-plane field is applied to the exchange coupled magnetic layer if one pair of Bloch lines or a state equal to zero is required of the bubble domains, or not applying the in-plane magnetic field if a bubble domain having no Bloch lines or a state equal to one is required.

An information store including the present invention comprises write means for obtaining domains of one of two known wall states including controlled generation or switching means. Means are included for inserting the controllably generated bubble domains into a confined or lattice array section of the bubble medium. Means are also included for retrieving the stored bubble domains from the lattice array for insertion into a sensing or read means. The read means senses the wall state of the retrieved bubble domains and transmits the data stored in the bubble domains to a utilization means. Propagation control means controls the movement of the bubble domains from the write means into the insertion means for insertion into the lattice array and from the retrieval means to the read means. Bias field means provide a magnetic field normal to the bubble medium for providing a proper bias magnetic field over different regions of the bubble medium, if desired, to stabilize the bubble domains in the bubble medium. Control means are provided to control the synchronous operations of the write means, the read means, the bias field means and the propagation control means. The controlled generation or switching means of the write means comprises an exchange coupled magnetic layer exchange coupled to the bubble medium in the area where bubbles are to be controllably generated. A nucleating means originates bubble domains in the bubble film are associated with the exchange coupled magnetic layer. Means are provided for controllably generating an in-plane field according to the binary data required to be inserted into the lattice array for storage.

The controlled generation of magnetic domains having a known wall state in the write means may comprise a controlled switching means which includes an exchange coupled magnetic layer established on the bubble medium in the area for insertion into the lattice array. Means are included for generating bubble domains in the bubble medium associated with the exchange coupled magnetic layer. Further, means are provided for controllably generating an in-plane field while providing a wall motion to the bubble domains according to the binary data information required to be stored by the bubble domain in the lattice array.

BRIEF DESCRIPTION OF THE DRAWING

Further features and a more specific description of an illustrated embodiment of the invention are presented hereinafter with reference to the accompanying drawing, wherein:

FIGS. 2 and 3 show two embodiments of apparatus for controllably generating bubble domains of a known wall state;

FIG. 4 is a cross-sectional view of the bubble medium, exchange coupled magnetic layer and in-plane field generator taken along lines 4—4 of FIGS. 2 and 3;

FIGS. 5A and B illustrate the two wall states controllably produced according to the present invention;

DESCRIPTION OF THE PREFERRED EMBODIMENT

Figure 1:
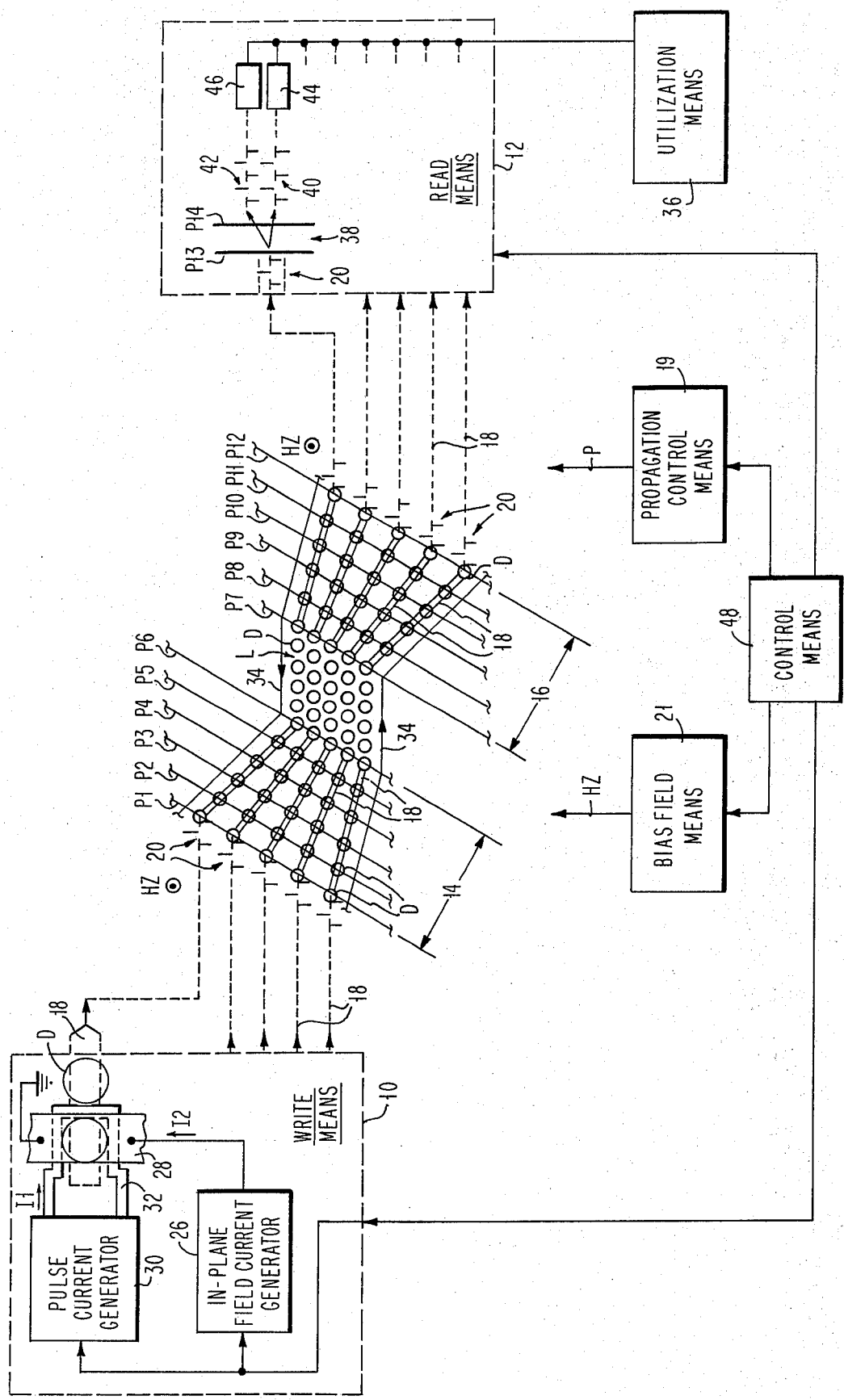
FIG. 1 shows an information store embodying the controlled generation of bubble domains having one of two wall states into a lateral entry lattice array.
Figure 13:
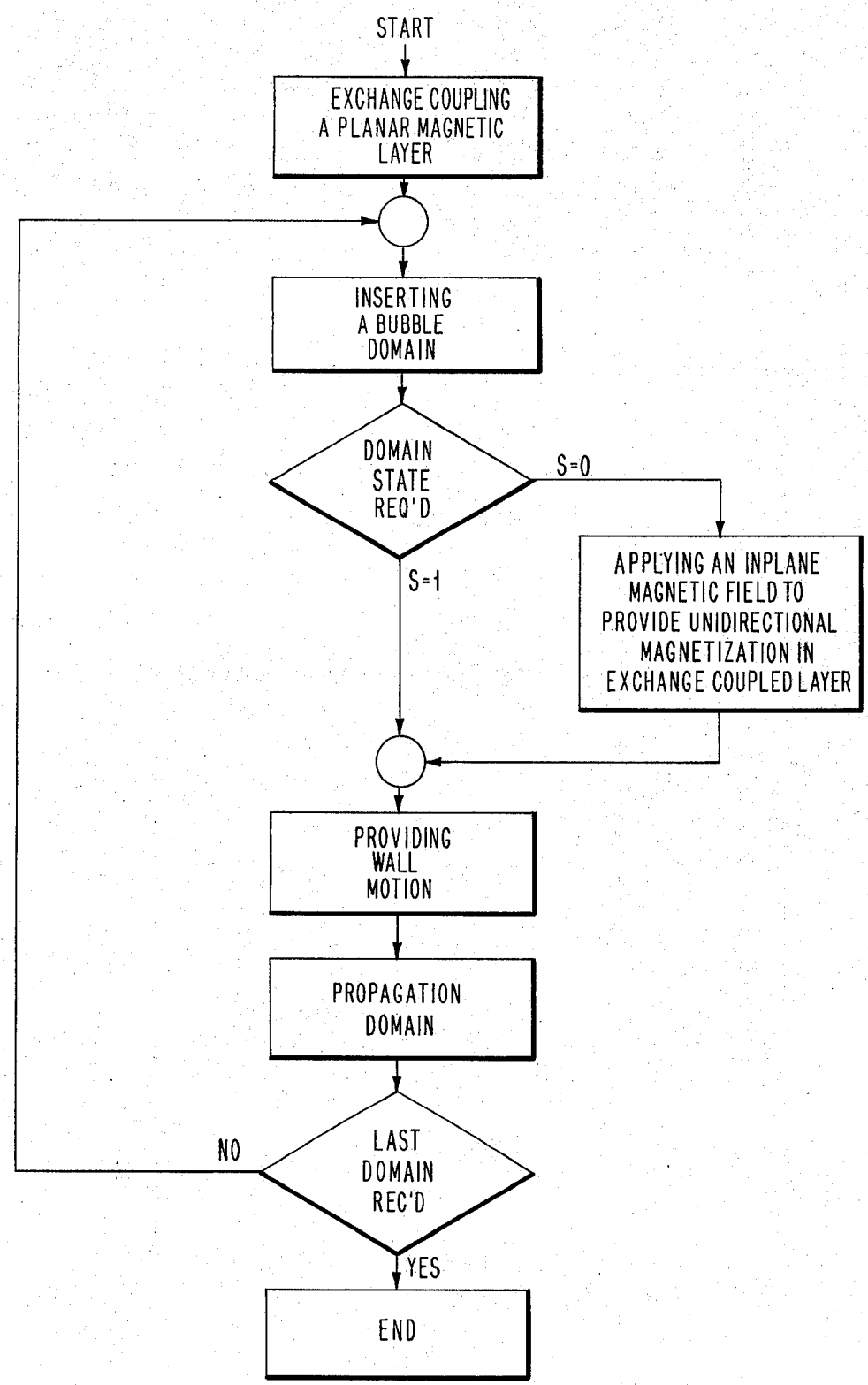
FIG. 13 shows an information store having a transverse insertion of controlled state bubble domains.

An information store containing the present invention is characterized by the formation and storage of bubble domains wherein the existence of one pair of Bloch lines or not in the bubble domain wall determines the binary data representation of each bubble domain. The ability of the bubble domain to represent either one of two binary states within itself permits the compacting of bubble domains into a confined area for storage while retaining their ability to represent binary data. The interaction between bubble domains provides a lattice array arrangement when a plurality of bubble domains are placed into a confined grouping. Two information stores using different forms of lattice arrays with the present invention are shown in FIGS. 1 and 13. A more complete description of the lattice array of FIG. 1 is given in the aforementioned U.S. patent application, Ser. No. 395,336.

FIG. 1 illustrates an information store including a lattice array element L for moving bubble domain interactive elements D in a medium supporting bubble domains from a write means 10 into the lattice array L and out of the lattice array L to a read means 12. Input means 14 and output means 16 utilize propagation conductor patterns P1–P12 for propagating the bubble domains D into and out of the lattice array L along a plurality of propagation paths 18. The propagation conductors are controlled by a propagation control means 19.

The bubble domains D move from the write means 10 using propagation structure 20 illustratively shown as T and I bars. In this region the bubble domains are isolated and an applied bias field HZ is provided by bias field means 21. Propagation using the T and I bar structure is well known in the art and the usual rotating in-plane magnetic field will be provided in this area. The propagation paths 18 from the write means 10 to the lattice array L and from the lattice array to the read means 12 are shown in the figures as having different apparent lengths. It is obvious that each length must be equal in order to maintain the integrity of each column of bubble domains as they are transported from the write means 10, along the fan in input means 14, through the lattice array L, out the output means 16 and into the read means 12. The different path lengths are for ease of the drawing and should not be taken that bubble domains of the same column reach the different elements at different times.

Five propagation paths 18 are shown directed to the input means 14 of the lattice array L from the write means 10. Only one apparatus is shown within the write means 10 for controllably generating bubble domains of either one of two set states, it being evident that each row of bubble domains and therefore each propagation path has its own controlled generating means. The state of the bubble domain is controlled by the magnetic structure of an exchange coupled magnetic layer associated with the medium supporting bubble domains D located with the write means. The area covered by the exchange coupled magnetic layer within the write means 10 and the bubble medium itself is not shown in FIG. 1 for ease of presenting the figure. The write means of FIG. 1 is shown in more detail in FIG. 2.

Referring especially to FIG. 2 and with reference to FIG. 1, the write means 10 comprises an exchange coupled magnetic layer 22 covering the bubble medium 24 in the write means area. An in-plane field current generator 26 generates a current I2 into a conductor 28 to a ground potential for producing an in-plane field in the exchange coupled magnetic layer 22. A pulse current generator 30 of the write means generates a current I1 into a nucleating means shown as a loop conductor 32. The relative position of the bubble medium 24, the exchange coupled magnetic layer 22, the loop conductor 32 and the in-plane field generating conductor 28 is shown in FIG. 4. It should be evident that an insulating means is necessary between the loop conductor 32 and the in-plane field generating conductor 28 to insulate the separate electrical current applied to each. The exchange coupled magnetic layer 22 can be any magnetic material having an in-plane easy axis of magnetization, capable of being exchange coupled to the bubble medium 24. Some examples of materials usable as the exchange coupled magnetic layer 22 are an ion-implanted layer, a magnetic garnet film, or a thin nickel-iron layer.

Figure 9:
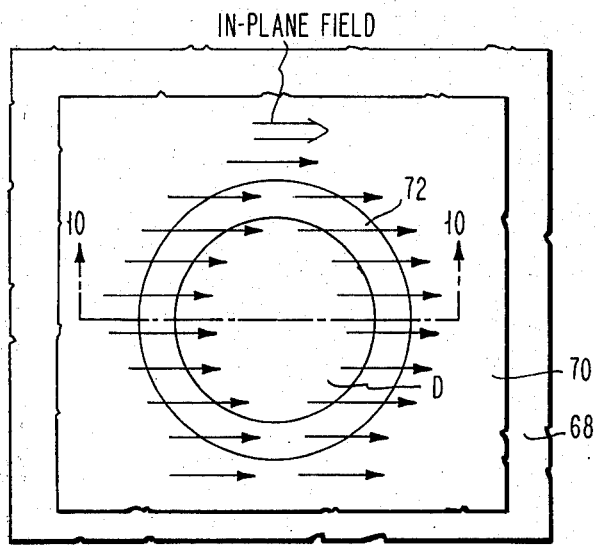
FIG. 9 is a top view of a bubble domain in a bubble medium with an in-plane field applied to the exchange coupled magnetic layer.

In the operation of the write means, the pulse current 30 is activated such that the loop conductor 32 generates a sudden reverse magnetic field to form a bubble domain D in a manner well known in the art. Without the application of the current I2 to the in-plane field conductor 28, a radially oriented magnetization occurs in the nucleating area and, as will be explained later in FIG. 7, the bubble domain nucleated will have no Bloch lines and thus have a state equal to one (FIG. 5A). If, however, the in-plane current generator 26 is activated during the time the pulse current generator 30 is activated, the in-plane field generated by the in-plane conductor 28 produces a unipolar magnetic field in the exchange coupled magnetic layer 22. This is shown in FIG. 9 and will be described with that figure later. The nucleation of a bubble domahn in the presence of the in-plane field being applied to the exchange coupled magnetic layer produces a bubble domain having one pair of Bloch lines, that is, a bubble domain having a state $S = 0$ (FIG. 5B). Thus, by activating the in-plane field current generator 26 or not, bubble domains having two different states can be produced representing binary data for storage in the lattice array L of FIG. 1.

Referring now to FIG. 1, bubble domains D which arrive at the right-most pole position of T bars prior to the input means 14 are separated by a distance of four diameters or 4d. These bubble domains are now ready to be moved gradually closer together to provide access to the lattice array L. Each controlled nucleating means of the write means 10 has simultaneously generated one column of bubble domains D for concurrent transmission into the lattice array L. The structure for placing the bubble domains into the lattice array is conveniently a plurality of propagation conductors P1–P6. Conductor P6 can also be part of the confinement for the lattice array L and part of the input means 14 for moving the bubble domains into the lattice array.

Propagation path 18 are provided to control the movement of the bubble domains D from the write means 10 into the lattice array L and from the lattice array to the read means 12. The propagation paths 18 can be conveniently provided by grooves formed in the bubble medium 24 supporting the bubble domains.

A confinement means is used to maintain the shape of a lattice array L and also to provide barrier forces along the fan-in and fan-out portions. Conveniently the confinement means can be provided by conductors 34 carrying currents in the directions indicated by the arrows on the confinement conductors 34 to produce a magnetic field opposing any bubble domain movement toward escaping the lattice array.

The propagation of bubble domains to the lattice array occurs by providing sequential current pulses in the conductors P1–P6. The movement of bubble domains by sequentially pulsing propagation conductors is well known in the art and need not be explained as further here. The propagation paths 18 insure that the bubble domains will stay on the appropriate path as they get closer to the lattice array, rather than separating in order to balance the increasing interactive forces as they move towards the lattice array. The confinement magnetic field provided by the current in the confinement conductors 34 can also maintain the relative positions of the bubble domains without need for the propagation paths 18. In this case, the currents in the conductors P1–P6 prevent the bubble domains from moving away from the lattice array and, coupled with the forces provided by the currents in the confinement conductors 34, will move the domains from isolated positions having a spacing of 4d to interactive positions having a spacing of 2d within the lattice array L.

Removing bubble domains from the lattice array is provided in a manner entirely similar to the input operation. The output means 16 is a geometric fan-out and the propagation conductors utilized to take the bubble domain D from the lattice array to positions where they are isolated, are designated P7–P12. When the bubble domains reach the lefthand pole position of the T bars at the output of the output means 16, they are separated by a distance of approximately 4d and can then be propagated to the right in the direction of the arrows, using the propagation structure 20 shown here as comprising T and I bar elements. The propagation structure 20 moves the bubble domains into the read means 12 for sensing of the binary data stored within the wall of each bubble domain. The binary data sensed can then be transmitted to a utilization means 36 for use therein.

It is well known in the art that bubble domains having different wall states deflect at different angles in a propagation field. Therefore, the read means 12 can comprise a plurality of deflecting channels 38, one for each row of bubble domains in the lattice array. Only one deflecting channel 38 is shown in the read means of FIG. 1, it being evident that each row has a sensing means for the bubble domains in its row.

Still referring to FIG. 1, he read means for each row includes two propagation conductors P13 and P14 and T and I bar propagation elements 20. At the input to the read means, and T and I bar propagation elements 20 together with the propagation channel 18 controls the path of all the bubble domains. Upon reaching the propagation conductor P13, the bubble domains no longer are under the control of the propagation channel 18 and are transported in the direction to the right of the figure only by the propagation conductors P13 and P14. Bubbles having a pair of Bloch lines, a state $S = 0$, will have only a horizontal propagation direction and are transmitted to the T and I bar propagation elements 40 at the end of the horizontal arrow. Bubble domains having no Bloch lines will deflect at an angle into another group of T and I bar propagation elements 42. At the end of the T and I bar propagation groups 40 and 42 are sensing elements 44 and 46, respectively. The sensing elements 44 and 46 can comprise the well known magnetoresistive element commonly used for sensing the presence of a bubble domain. Thus either bubble state can be sensed in the read means 12 and the data transmitted to the utilization means 36 as required. A further description of a magnetic domain system using bubble domains having different states can be obtained by referring to a co-pending application, Ser. No. 375,289, filed June 29, 1973, and assigned to the assignee of the present invention.

The control of the sequences of operation for the write means 10, the T and I bar propagation paths 18 and its associating rotating field, the propagation control means 19, and the read means 12 is under the control of a control means 48. The control means 48 controls the operation to form the bubble domain according to the data required, to propagate the bubble domains into and out of the lattice array L, and to sense and utilize the data from the bubble domains when retrieval is required. The various means and circuits described in FIG. 1 may be any such element capable of operating in accordance with this invention.

Referring to FIG. 3, a second embodiment of the write means 10 of FIG. 1 is shown. Again the material requirement for the controlled generation of bubble states is the bubble medium 24 that has the properly treated exchange coupled magnetic surface layer 22 such as an ion-implanted layer, a thin garnet film, or a nickel-iron film. The write means 10 of FIG. 3 comprises a nucleating conductor 50 formed over the exchanged coupled magnetic layer 22. The nucleating conductor 50 contains a confinement groove 52 for concentration of the electrical current from a pulse current generator 54. An in-plane field conductor 56 controlled by an in-plane current generator 58 for applying an in-plane field to the exchange coupled magnetic layer 22 is placed over and insulated from the nucleating conductor 50.

The operation of the write means of FIG. 3 is that the control means 48 (FIG. 1) activates the pulse current generator 54 to nucleate a bubble domain D in the area of the confinement groove 52. If the generation of a bubble domain having no Bloch lines is required (FIG. 5A), the in-plane field current generator 58 is not activated by the control means 48. A nucleation current pulse is generated by the pulse current generator 54 without the in-plane field being applied and a bubble domain having no Bloch lines will be generated. This bubble domain could represent a binary state of one, for instance. Propagation means (not shown) are used to propagate the nucleated bubble domain from the write means 10 into the lattice array L of FIG. 1, for instance, for storage therein.

If a bubble domain of a binary state equal to zero is required, a bubble domain having one pair of Bloch lines, a state equal to zero (FIG. 5B), can be nucleated by the write means. In this event, the in-plane field current generator 58 is activated by the control means to apply an in-plane magnetic field to the exchange coupled magnetic layer 22. The nucleating means, the pulse current generator 54 and the nucleating conductor 50 are then activated in the presence of this in-plane field and, as previously explained, a bubble domain will be nucleated having one pair of Bloch lines (FIG. 5B). The bubble domain will again be nucleated in the area of the confinement groove and can then be propagated out of the write means for storage.

FIGS. 5A and 5B illustrate the states of the bubble domains produced according to the present invention. FIG. 5A shows two bubble domains D magnetized normal to the plane of the figure and having a Bloch wall 60. Two bubble domains are shown having a state $S = 1$, no Bloch lines. The bubble domains can have either direction of rotation of the wall magnetization while retaining the same state. Either of these domains is produced by the write means 10 of FIGS. 2 and 3 without the actuation of the in-plane field generating means.

The bubble domains D of FIG. 5B has one pair of Bloch lines 62 within its domain wall 64. The pair of Bloch lines 62 twist within the wall to align with the direction of the in-plane field in the exchange coupled magnetic layer. Bubble domains having a state $S = 0$ as shown in FIG. 5B are produced by the write means 10 of FIGS. 2 and 3 when the in-plane field is activated.

Figure 6:
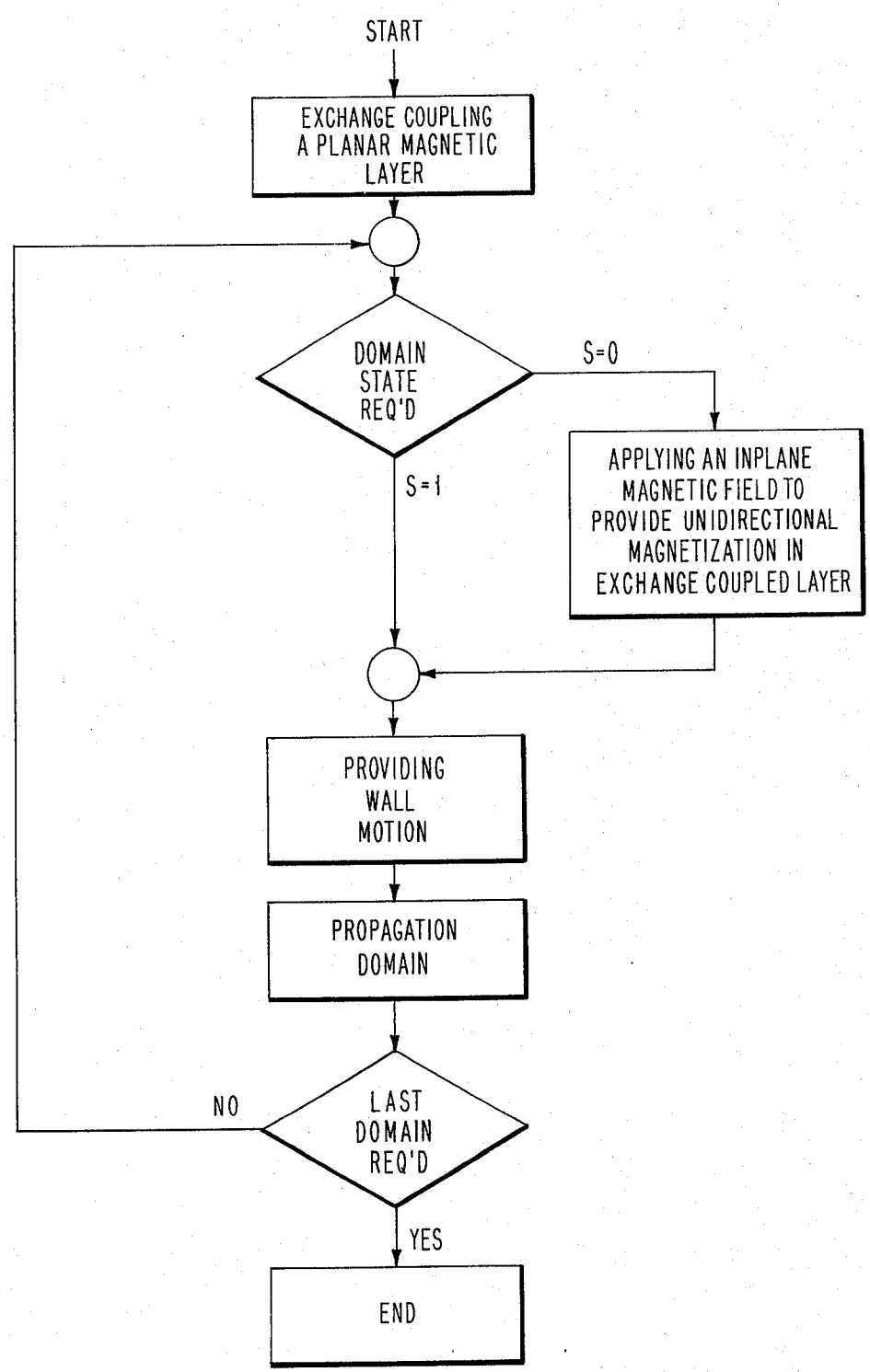
FIG. 6 is a flow diagram of the steps to generate bubble domains having two wall states.

The method steps required to controllably generate a series of bubble domains having two different wall states for the write means 10, for instance, of the information store illustrated in FIG. 1 are shown in FIG. 6. Referring to FIG. 6, the first step is exchange coupling a planar magnetic layer to a medium supporting bubble domain. This exchange coupled magnetic layer may be positioned above or below the bubble medium. As stated previously, the planar layer could be an ion-implanted layer, a planar magnetic garnet film, or a thin nickel-ion layer. The next step is to determine the domain wall state required. If a wall state S equal to zero is required, the subsequent step taken is to apply an in-plane magnetic field to the magnetic layer through any of the well-known means available. After the application of the magnetic field to the magnetic layer or directly if a domain state of one is required, the next step is to nucleate or originate a bubble domain. The nucleation step provides sufficient wall motion to determine the state of the domain wall together with the magnetization of the planar layer or not as previously discussed. The nucleated domain is propagated for utilization and the flow diagram either returns to determine the bubble state of the next bubble domain, if any, or ends the process.

Figure 7:
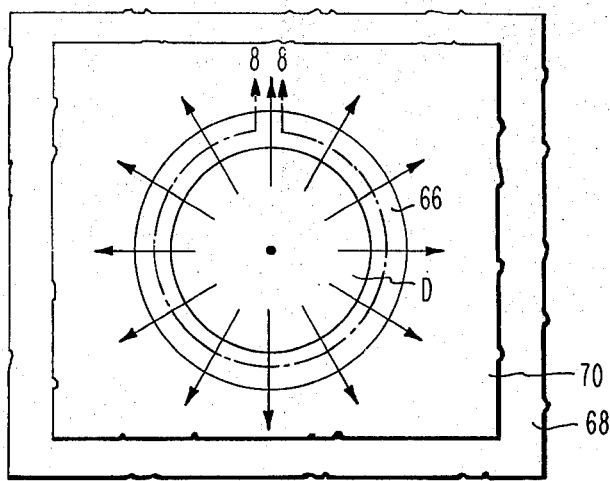
FIG. 7 illustrates the radially oriented magnetic field produced by a bubble domain with an exchange coupled magnetic layer.

An explanation, as best understood, of the occurrences within the bubbles domains, the bubble medium, and the exchange coupled magnetic layer to the bubble medium to arrive at the controlled generation of the known wall states is shown and described in FIGS. 7–10. Bloch lines in the bubble domain wall move up and down in the wall when the motion of the wall reaches a certain critical velocity such as that attained during the nucleation of a bubble domain. At that critical velocity, Bloch line pairs can be nucleated or annihilated depending on the magnetic structure in the boundary layers of the bubble medium. In mediums with no special treatment, i.e., no planar exchange coupled magnetic layer, the nucleation and annihilation of Bloch lines at the boundary layers is random process and the number of Bloch line pairs in the bubble domain cannot be easily controlled. In bubble mediums that have an exchange coupled magnetic layer, such as an ion-implanted layer, a planar magnetic garnet film, or a thin nickel-iron layer the situation becomes different. The in-plane magnetization of the layer as coupled by exchange forces to the magnetic bubble domain occuring in the bubble medium associated will the capping layer is depicted in FIG. 7

Figure 8:
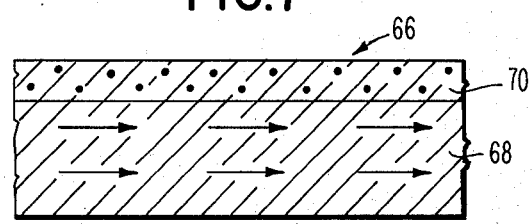
FIG. 8 is a side view of the bubble domain wall of FIG. 7 unwrapped in the direction of the arrows 8—8.

Referring to FIG. 7, the bubble domain D is shown having a Bloch wall 66 and existing in a bubble medium 68 covered by an exchange coupled magnetic layer 70. The layer 70 is shown to be above the bubble medium 68 but it is understood that layer 70 may be below the bubble medium 78. The magnetic field applied to exchange coupled magnetic layer 70 becomes a radially oriented field with the existence of the bubble domain D. The bubble domain, absent an externally applied in-plane field, has no Bloch lines and thus a state $S = 1$. FIG. 8 shows a view of the bubble domain with the wall 66 cut and spread laterally from the arrows 8 of FIG. 7. The bubble domains under the exchange coupled magnetic layer 70 produce a radially oriented magnetization pattern with no outside force, that is, the in-plane field HX is equal to zero.

In any magnetic structure having a magnetization normal to its surface with Bloch twists, such as a bubble domain in a bubble medium containing Bloch lines in its wall, there is a spot on the surface that has the opposite magnetization to the twists. With an exchange coupled magnetic layer, this spot, a Bloch point, cannot exist on the surface of the exchange coupled magnetic layer but rather exists between the exchange coupled magnetic layer and the normal magnetized structure, the bubble medium. The Bloch point is pushed off the surface by the thickness of the exchange coupled magnetic layer. The magnetization of the exchange coupled magnetic layer is radially oriented. The Bloch point it pinned on the surface of the bubble medium and therefore, is stabilized. A rather large force is required to dislodge it from the surface. With the exchange coupled magnetic layer, the Bloch point is less stable because it lacks a surface pinning. Any wall motion exceeding a critical velocity will cause the Bloch point to untwist thereby removing all Bloch lines within the domain wall.

Figure 10:
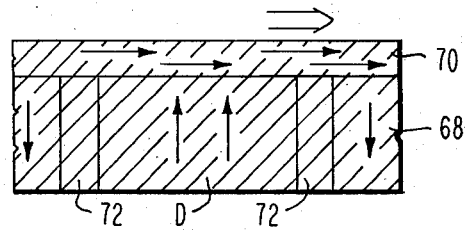
FIG. 10 is a cross-sectional view of a bubble domain of FIG. 9 taken across lines 10—10.

An externally applied in-plane magnetic field to the bubble medium 68 having a bubble domain D in the area of the exchange coupled magnetic layer 70 as shown in FIGS. 9 and 10 can saturate the surface exchange coupled magnetic layer 70 and unidirectionally align the surface magnetization in the exchange coupled magnetic layer. With the application of the in-plane magnetic force unidirectionally aligning the magnetic direction of the exchange coupled magnetic layer 70, applying a force sufficient to produce bubble domain motion exceeding a certain critical velocity will cause the bubble domain wall 72 to interact with the exchange coupled magnetic layer 70 and one pair of Bloch lines will be formed in the domain wall (FIG. 5B). Once the pair of Bloch lines is fixed in a bubble domain, removing the externally applied unipolar magnetic in-plane field will not alter the domain wall structure as long as the movement of the velocity of the domain wall is kept below the critical threshold.

With the application of the in-plane magnetic field, the exchange coupled magnetic layer 70 is magnetized in one direction. Through exchange coupling, the stable wall structure of a bubble domain in this environment is with one pair of Bloch lines. A wall motion beyond a certain critical velocity facitlitates the forming of one pair of twists by moving the wall magnetization to interact with the exchange coupled magnetic layer. The Bloch lines will be formed in the direction of the in-plane field (See FIG. 5B). A description of the effect of the exchange coupled magnetic layer on the wall structure of the bubble domain under the exchange coupled magnetic layer, as best understood, is given in the aforementioned article, "The Effect of a Second Magnetic Layer on Hard Bubbles". In essence, the structure of the magnetic in-plane layer exchange coupled with the bubble medium can control the type of bubble domains that exist in the nucleating region associated with the magnetic in-plane layer. The control is through the interaction of the bubble domain wall with the exchange coupled magnetic layer. It is a requirement that the bubble domain wall be propagated or moved beyond a certain critical velocity.

As an example of a suitable apparatus for controllably generating bubble domains which comprises a bubble medium of a magnetic garnet with normal magnetization and a nominal composition of $Y_{2.35}E\mu_{0.65}Ga_{1.2}F_{3.8}O_{12}$ having 4μm thickness for a 5um bubble diameter. The bubble medium is formed on a non-magnetic garnet substrate with a composition of $Gd_3Ga_5O_{12}$. The planar exchange coupled magnetic layer can be an ion-implanted layer of 0.1 μm thick. For bubble nucleation, a gold conductor could be used with a current pulse of 300 mA being applied for 50–100 nanoseconds to originate the bubble domains. The in-plane field that is applied to provide the unidirectional magnetization can be between 80–100 oe.

Figure 11:
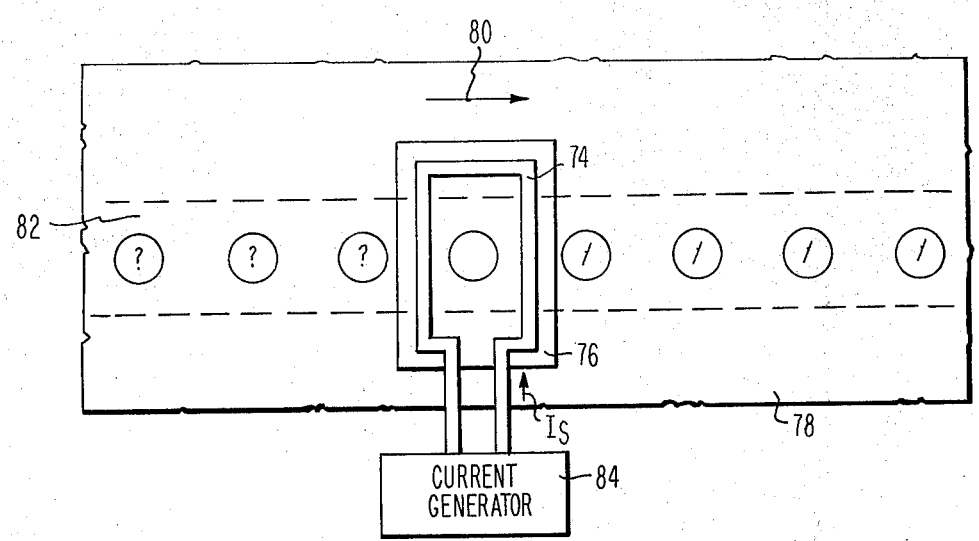
FIG. 11 illustrates one embodiment for the controlled switching of bubble domains of an unknown state to a state equal to one.
Figure 12:
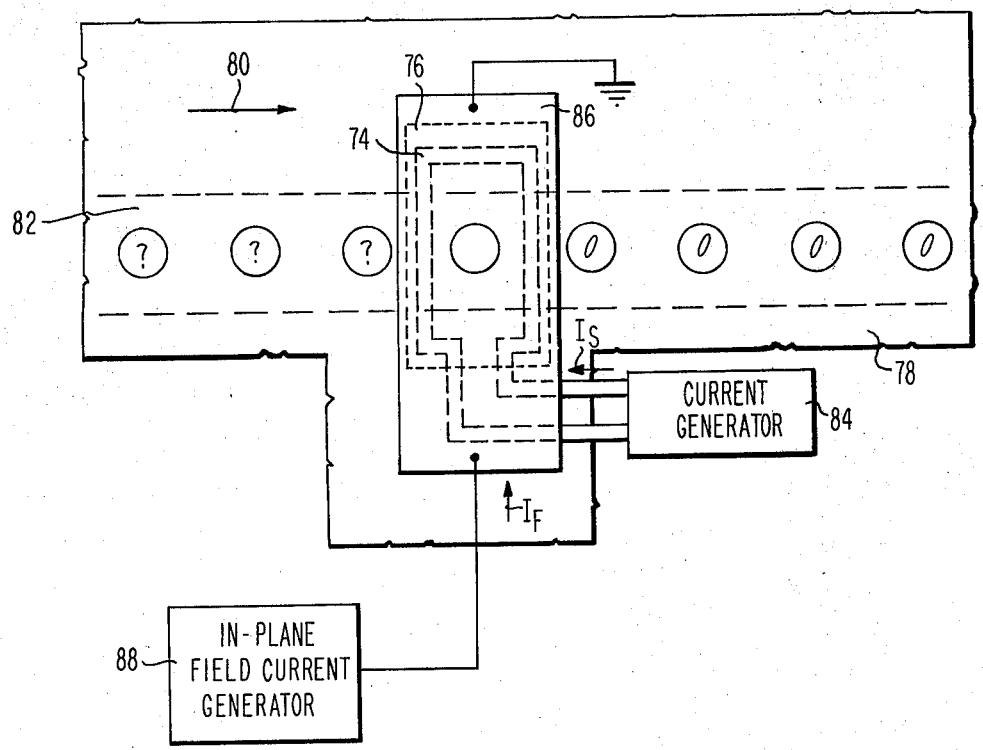
FIG. 12 illustrates an apparatus for the control switching of bubble domain from an unknown state to a state equal to zero.

It is possible in using the present invention to provide a controlled switching of bubble domains from an unknown state to a known one of two states. In the unknown state, the bubble domains can have any number of Bloch lines or no Bloch lines and the resultant bubble domains will be of a known state. FIGS. 11 and 12 show the apparatus for the controlled switching of bubble domains from an unknown state to a known one of two states. FIG. 11 shows the controlled switching to obtain bubble domains having no Bloch lines, a state $S = 1$. FIG. 12 shows the application of an in-plane field to obtain bubble domains having one pair of Bloch lines, a state $S = 0$. An information store using the controlled switching as the write means is shown in FIG. 13 and will be discussed later.

Referring to FIG. 11, a velocity inducing means shown as a loop conductor 74 is formed on the surface of an exchange coupled magnetic layer 76. The exchange coupled magnetic layer 76 is again formed on the surface of a magnetic medium 78 supporting the bubble domains. The direction of propagation of the bubble domains is in the direction of an arrow 80 in the plane of the figure.

The bubble domains having an unknown state, as shown by the circles containing a question mark, are propagated in the bubble medium associated with the exchange coupled magnetic layer within a propagation channel 82 by any suitable propagation means such as propagation conductors (not shown). When each bubble domain is located in the bubble medium associated with the exchange coupled magnetic layer 75, a current generator 84 is activated thereby subjecting the bubble domain contained within the loop conductor 74 to a wall motion by virtue of the field gradient generated by the loop conductor 74. As stated previously, subjecting a bubble domain to a velocity beyond a critical threshold in the area of an exchange coupled magnetic layer removes all of the Bloch lines from the domain wall. This is also assuming that no in-place field is present in the exchangy coupled magnetic layer such as shown in FIG. 12. The induced velocity component forces the twist within the wall of a domain to return to the stable state with the exchange coupled magnetic layer 76 which is a bubble with no Bloch lines. Thus, each bubble domain subjected to this wall motion loses any Bloch lines previously contained within its wall and therefore is controllably switched to a known state $S = 1$.

To controllably switch an unknown state bubble domain to a state having one pair of Bloch lines, a state $S = 0$, the unknown state bubble domains are subjected to a wall motion in an in-plane magnetic field as shown in FIG. 12. In FIG. 12, again the unknown bubble domains are propagated in the direction of the arrow 80 in the propagation channel 82 into the area of the bubble medium associated with the exchange coupled magnetic layer 76. An in-plane field conductor 86 is formed over the loop conductor 74 and thus becomes a part of the switching means together with the velocity generating means, the loop conductor 74. As in FIG. 11, the loop conductor 74 is formed over the exchange coupled magnetic layer 76 which, in turn, covers a portion of the bubble medium 78 in the controlled switching area. The in-plane field conductor 86 is formed over and insulated from the loop conductor 74. The in-plane field conductor 86 can be suitably activated for the generation of the in-plane magnetic field in the exchange coupled magnetic layer 76 by a current pulse from an in-plane field current generator 88.

In operation, the bubble domains having an unknown state, depicted as circles with the question mark, are suitably generated and propagated into the controlled switching area. The bubble domains in the switching area are subjected to a wall motion by the generation of the current IS by the current generator 84. This wall motion occurs within the bubble domains in the switching area in the in-plane field gradient produced by the in-plane field conductor 86 and the current IF. As previously described, providing a wall motion to the bubble domain within the in-plane field produces a bubble domain having one pair of Bloch lines, a state $S = 0$. The controlled switching according to the present invention is produced by the wall motion induced by the loop conductor 74 and the current IS generated by the pulse current generator 84. The in-plane field applied to the exchange coupled magnetic layer 76 fosters the controlled switching by encouraging the winding of Bloch lines within the domain wall and encouraging one pair of twists and thus the one pair of Bloch lines.

The use of two embodiments to arrive at the generation of bubble domains having two states as shown in FIGS. 11 and 12, is not necessary. The embodiments were shown separately for ease of discussion. It is evident that the preferred embodiment is that shown in FIG. 12. The in-plane field current generator 88 can be suitably controlled to provide an in-plane field in the exchange coupled magnetic layer 76 or not as desired to generate bubble domains having either a state equal to zero or one.

The wall motion component separately generated in FIGS. 11 and 12 can also be supplied by the in-plane field generating conductor. Providing bubble domain propagation by conductors is well known. The in-plane field generating conductor is usually a wider conductor but both produce the same effects, a field gradient having both a vertical and a horizontal component. The bubble domain velocity component resulting from a conductor found on a bubble medium is discussed in an article *Bubble Mobility in a System*, by N.F. Borelli et al., published in the AIP Conference Proceedings, No. 10, Part 1, 1972 at pp. 398–402. Thus, the in-plane field generating means and the wall motion or velocity generating means can be provided by the in-plane field conductor 86 of FIG. 12.

FIG. 13 shows a detailed diagram of a column accessing lattice array of bubble domains implementing the write means according to the present invention. Any of the write means previously discussed can be used with the column access lattice array, with the preferred embodiment being the combination of a controlled nucleating means, the nucleating conductor of either FIGS. 2 or 3 without the in-plane field generating means, and the controlled switching means of FIG. 12. The nucleating means nucleates bubble domains having a state $S = 1$. The switching means can then be activated or not to switch only those bubble domains which are to store an opposite binary state.

In more detail, the lattice array L of magnetic bubble domains D in FIG. 13 is confined within the confinement means 100. Confinement means 100 is a barrier to prevent the escape of bubble domains D and serves to keep these domains within a confined area. As is apparent, the confinement means 100 is also used around a read and write means and the input and output columns which extend transverse to the lattice array L. For a complete description of the operation of the information store shown in FIG. 12, reference is made to a co-pending application, Ser. No. 429,601, filed on Jan. 2, 1974 and assigned to the assignee of the present invention. A generalized description of the information store of FIG. 13 will now be given for the purposes of implementing the present invention.

The lattice array L can be initialized with a plurality of bubble domains D and the buffer area 128L and R located at the lefthand end and the righthand end of the lattice array, respectively. The buffer areas 128L and R comprise stripe domains S together with means 132L and 132R for the generation and annihilation of the stripe domains. The stripe domains S may alternatively be positioned horizontally in the lattice. For instance, means 132L includes conductors 134A and 134B which are connected to buffer current sources 136A and 136B, respectively. On the righthand end of the lattice array L, means 132R includes conductors 138A and 138B, connected to buffer current sources 140A and 140B, respectively.

The operation of the generation and annihilation means 132L and 132R will be explained in more detail later. At this time it is appropriate that these structures are used to generate and annihilate stripe domains in the buffer zones 128L and 128R. This generation and annihilation of stripe domains is used to translate the lattice array L to the right or to the left while providing for the maintenance of the integrity of the lattice array. The lattice array L must at all times contain a full complement of stripe domains S and bubble domains D to prevent loss or misplacement of the data information carried by the bubble domains D.

A bias field source 126 provides a magnetic bias field HZ substantially normal to the plane of the lattice array L. Source 126 can be any of the number of well known sources, including permanent magnets, magnetic layers exchange coupled to the magnetic medium in which the bubble domains exist, and current carrying conductors. For instance, it is desirable to have a different value of bias field within lattice array L than outside the lattice array in the write means 150. Techniques for doing this are within the skill of the art and are also described in the aforementioned U.S. patent application. Ser. No. 395,336.

In FIG. 13, two write stations shown as write means 150A and 150B are provided at the top of the lattice array L. At the bottom edge of the lattice array L, two read stations are provided. In general, the write stations are used to produce bubble domains which, in turn, are used to push the bubble domains out of the lattice array into the associated read stations within one column accessing section. Two column accessing sections are provided in the embodiment of FIG. 13, therefore, two columns of bubble domains D can be pushed out of the lattice array into the associated read stations for detection of the information carried by the bubble domains. It should be noted that in the lattice array L of FIG. 13, the generalized translation direction of the bubble domains within the lattice array including the stripe domains S and the bubble domains D is from left to right or right to left, while the removal of a column of bubble domains from the lattice array is essentially transverse to this horizontal left-right direction.

The write means 150B, for instance, comprises an exchange coupled magnetic layer 151B formed over the bubble medium in the area of the write station. A nucleating conductor 154B is connected to a pulse current generator 156B for the nucleation of bubble domains. A switching means 157B is shown driven by a velocity generating means 158B and an in-plane field generating means 159B. The switching means 157B comprises a wall motion generating means and a means generating the in-plane field. The wall motion generating means can comprise the loop conductor 74 and current generator 84 of FIG. 12 and the current conductor 86 and in-plane field current generator 88 can provide the in-plane field required.

In operation, the pulse current generator 156B, under control of the control means 195 generates a current for transmission through the nucleating conductor 154B whenever a bubble domain is required. As previously discussed, with the exchange coupled magnetic layer 151B and no in-plane field, all bubble domains nucleated will have no Bloch lines, a state $S = 1$. These bubble domains could represent a binary state of zero. All bubble domains are then passed through the switching means 157B where, if a bubble domain is subjected to a wall motion by the loop conductor 74 and current generator 84, for instance, this bubble domain will be switched to a state $S = 0$. Thus, all of the bubble domains generated can represent a binary "0" state and then selected bubble domains can be switched to represent a binary "1".

Each write station is comprised of the write means 150A and B and a pusher means 152A and B for serially pushing domains into a bubble domain pump. Two pumps are provided in FIG. 13 for moving bubble domains in the two columns out of the lattice array L. The pumps comprise current carrying conductors 142L and 142R connected to pump current sources 148L and 148R respectively.

The operation of the pump propagation means is explained in detail in a co-pending U.S. Pat. No. 3,913,079, filed on Jan. 2, 1974, and assigned to the assignee of the present invention. Essentially, currents in a pair of pump conductors 142L and R cause expansion of bubble domains between the conductors. This expansion causes other bubble domains to move with the net result that propagation of bubble domains occurs in the column defined by the pump conductors. The write means provides a coded bubble domain for information storage while the pushers 152A and 152B push the bubble domains in serial fashion into the column defined by the associated pump propagation means.

The read or sensing means is generally comprised of a bubble domain serial puller 166A, a bubble domain serial pusher 168A, and a bubble domain sensing means. Puller 166A comprises conductors 172L and 172R, which are connected and actuated by puller current source 174A. Serial pusher 168A includes conductors 176L and 176R which are connected to a pusher current source 178A. Serial puller 166A moves bubble domains in serial fashion, one at a time, from the column of the associated bubble pump. Serial pusher 168A is used to push bubble domains, one at a time, toward the direction of the y-shaped confinement 180A. Pusher 168A is also used to create a gradient magnetic field in the y-shaped region defined by the boundaries of the confinement means 100. This, in turn, is used to deflect the bubble domains in accordance with their wall magnetization structure. As explained previously, the bubble domains can be detected for their information content according to their deflection in a propagation field.

The sensing means is illustrated as comprising a conductor connected to a sensing element 184A, which can conveniently be a magnetoresistive element of the type well known in the art. A sensor current source 185A produces an electrical current through a sensor element 184A. As shown in FIG. 13, an elongated bubble domain 186 is adjacent the sensor 184A and is in the position for being sensed.

A conductor loop 188A is adjacent the lefthand leg of the y-shaped propagation channel while a conductor loop 190A is adjacent the righthand portion of the y-shaped propagation channel. Conductor loop 188A is connected to a current source 192A while conductor loop 190A is connected to a current source 184A. Conductor loops 188A and 190A are used for extension and collapse of bubble domains in the respective portions of the y-shaped propagation channel. That is, current in loop 190A will expand the domain 186 to provide a maximum signal to be sensed by the detector 184A. Later the same conductor loop can be used to annihilate the bubble domain 186.

A control means 195 synchronizes the operation of the various components used in the information store of FIG. 2. Control 195 provides input trigger pulses to the pump current sources 144, pusher current sources 156, 178, puller current sources 174, buffer current sources 136 and 140, sensor current sources 185, bias field source 126, write means 150, and current sources 192 and 194.

The number of stripe domains S required in the buffer zones of the lattice array channel depends on the size of the lattice array and on the number of column addressing devices. That is, there must be a sufficient number of stripe domains to be able to move all of the information carrying bubble domains within the lattice array to a column device for accessing. The stripe domains have approximately the same width and spacing as the bubble domains within the lattice array. Therefore, it can be readily calculated how many stripe domains are needed for a lattice of a given size and a given area, with a given amount of input and output column accessing devices. The fundamental principle is that the buffer zones should have a sufficient number of stripe domains to insure that all bubble domains will be able to be translated to a column for accessing from the lattice array. During this translation operation, the total number of stripe domains $S$ in both buffer zones remains constant. The stripe domains S may be positioned in a column as shown in the drawings or they may be positioned horizontally in a row.

Figure 14:
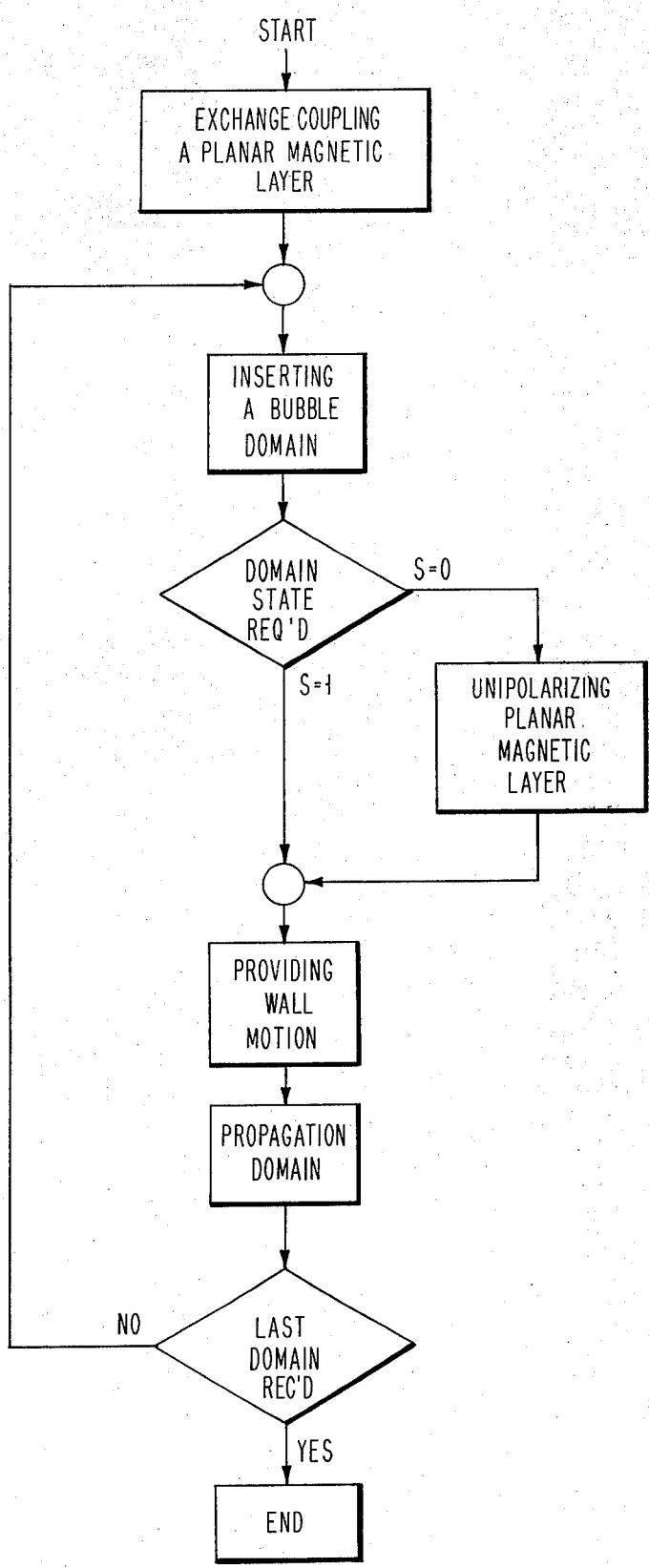
FIG. 14 is a flow diagram of the steps to switch the wall states of bubble domains.

The method steps required to controllably switch a series of bubble domains as shown in FIG. 12 are shown in FIG. 14. Referring to FIG. 14, the first step is exchange coupling a planar magnetic layer to a medium supporting bubble domains. The next step is to insert a bubble domain. The bubble domain inserted can have any wall state. The next step is to determine the final wall state required. If a wall state S equal to zero is required, the subsequent step taken is to apply an external field to provide unidirectional magnetization in the magnetic layer through any of the well-known means available. After the unidirectional magnetization of the magnetic layer or directly if a domain state of one is required, the next step is providing a sufficient wall motion to the bubble domain to cause wall magnetization instability. The resultant bubble domain will have a wall state of either 1 or 0 depending upon the path taken. The bubble domain is propagated for utilization and the flow diagram either returns to controllably switch another bubble domain, if any, or ends the process.

A variation of the method steps of FIGS. 6 and 14 can be obtained as discussed with the write means of FIG. 13. The first step is still exchange coupling a planar magnetic layer to a bubble medium. The step of inserting a bubble domain is by nucleation or some other originating means, which includes a substantial wall motion. All of the bubble domains nucleated will have a state S equal to one. The nucleated bubbled domains are propagated to a switching area. If a bubble domain in the switching area is to be switched in state to a zero, the next step is providing unidirectional magnetization in the magnetic layer and providing the wall motion. Only selected bubble domains are switched, depending upon the resultant bubble domain state required. The bubble domain is propagated for utilization and the flow diagram either returns to provide another controlled state bubble, if needed, or ends the process.

An example of a suitable apparatus to controllably switch bubble domains comprises the same bubble medium, an exchange coupled magnetic layer, nucleating conductor and in-plane field as given in the example for controllably generating a bubble domain. The in-plane field must be in excess of a certain in-plane field which can be determined experimentally. The critical in-plane field was found to be between 40–50oe. The in-plane field conductor at this field strength also provides a velocity producing component (bias field gradient) for wall motion. Any in-plane field in the exchange coupled magnetic layer beyond this value in the example material given will provide apparatus for controllably switching bubble domains from an unknown state to a known state.

The principles of the invention have now been made clear in illustrated embodiments. What has been described is a technique for controllably generating bubble domains having one of two different states for use within a lattice array. It will be immediately obvious to those skilled in the art that many modifications of structure, arrangements, proportions, the element, materials, and components may be used in the practice of this invention. For instance, the nucleating means described in the embodiments of the present invention such as in FIGS. 2 and 3, may be any type of source for initiating bubble domains such as a laser beam. Further, the in-plane magnetic field source may also be of any type including a permanent magnet, it being the intention of the present invention that some switchable means of activating or not the in-plane magnetic field in the exchange coupled magnetic layer be provided. Similarly, with the controlled switching means of FIGS. 11 and 12. Again it should be evident that there are many types of velocity generating means that could replace the loop conductor of these figures, it being only necessary that a magnetization of the domain wall be placed in an unstable state for either removing all of the Bloch lines from the domain wall or controllably inserting one pair of Bloch lines within the domain wall in conjunction with the exchange coupled magnetic layer. The appended claims are, therefore, intended to cover and embrace any such modification, within the limits only of the true spirit and scope of the invention.

I claim:

1. Apparatus for selectively generating coded soft bubble domains having a single wall state in a medium supporting bubble domains, said single wall state being $S=1$ in the absence of activation of an in-plane magnetic field, said single wall state being $S=0$ with activation of an in-plane magnetic field, said apparatus comprising,
   a magnetic layer exchange coupled to a section of a bubble medium,
   means for nucleating bubble domains entirely within said section; and
   means for applying an in-plane magnetic field to a portion of said layer associated with said nucleation means when a bubble having an $S=0$ state is to be formed.

2. Apparatus as described in claim 1 wherein said magnetic layer is an ion-implanted layer in the bubble medium.

3. Apparatus for controllably switching the wall state of a soft bubble domain to a selected single wall state in a medium supporting bubble domains, said selected single wall state being $S=1$ in the absence of activation of an in-plane magnetic field, said selected single wall state being $S=0$ with activation of an in-plane magnetic field, said apparatus comprising,
   a magnetic layer exchange coupled to the bubble medium;
   means for entering a bubble domain into the bubble medium associated with said layer;
   means for applying an in-plane magnetic field to the portion of said layer associated with said means for entering a bubble domain when a bubble having a selected $S=0$ wall state is to be formed; and
   means for generating a velocity producing component to the bubble domain to provide wall motion sufficient to cause magnetic orientation instability in the domain wall.

4. An apparatus as described in claim 3 wherein said means for generating a velocity producing component to the bubble domain includes a loop conductor associated with a current generator.

5. An apparatus as described in claim 3 wherein said means for applying an in-plane magnetic field to said layer includes an in-plane field conductor associated with a current generator.

6. A method of forming a soft bubble domain having a selected single wall state, said selected single wall state being $S=1$ in the absence of activation of an in-plane magnetic field, said selected single wall state being $S=0$ with activation of an in-plane magnetic field, comprising the steps of
   a. exchange coupling a magnetic layer to at least a section of a medium supporting bubble domains, and
   b. nucleating a domain entirely within said section associated with said magnetic layer.

7. A method as described in claim 6 wherein the step of exchange coupling a planar magnetic layer to a section of the medium is performed by ion-implanting the medium to form a layer having in-plane magnetization.

8. A method as described in claim 6 whereby said nucleating step is carried out in the absence of an in-plane field being applied to said magnetic layer to form a bubble domain having an $S=1$ wall state.

9. A method as described in claim 6 whereby said nucleating step is carried out in the presence of an in-plane magnetic field of sufficient strength being applied to said magnetic layer associated with said section to form a bubble domain having an $S=0$ wall state.

10. A method as described in claim 3 whereby the strength of the in-plane field is of the order of 80 to 100 Oe.

11. A method of forming a soft bubble domain having a selected single wall state, said selected single wall state being $S=1$ in the absence of activation of an in-plane magnetic field, said selected single wall state being $S=0$ with activation of an in-plane magnetic field, comprising the steps of
   a. exchange coupling a magnetic layer to at least a section of a medium supporting bubble domains,
   b. generating a bubble domain, and c. moving said bubble domain in said section of said medium at a velocity sufficient to cause magnetic orientation instability in the wall of said bubble domain.

12. A method as described in claim 11 whereby said moving step is carried out in the absence of an in-plane field being applied to said magnetic layer to form a bubble domain having an $S=1$ wall state.

13. A method as described in claim 11 whereby said bubble domain moving step is carried out in the presence of an in-plane magnetic field of sufficient strength being applied to said magnetic layer associated with said section to form a bubble domain having an $S=0$ wall state.

14. A method as described in claim 13 whereby the strength of said in-plane field is in excess of 40 to 50 Oe.

15. A method of switching the wall state of a bubble domain from a wall state of $S=0$ containing one pair of Bloch lines to a wall state of $S=1$ containing no Bloch lines comprising the steps of
 a. exchange coupling a magnetic layer to at least a section of a medium supporting bubble domains,
 b. generating a bubble domain having a wall state of $S=0$, and
 c. moving said bubble domain in said section of said medium in the absence of an in-plane field being applied to said magnetic layer at a velocity sufficient to cause magnetic orientation instability in the wall of said bubble domain whereby the wall state becomes $S=1$.

16. A method of switching the wall state of a bubble from a wall state of $S=1$ containing no Bloch lines to a wall state of $S=0$ containing one pair of Bloch lines comprising the steps of
 a. exchange coupling a magnetic layer to at least a section of a medium supporting bubble domains,
 b. generating a bubble domain having a wall state of $S=1$, and
 c. moving said bubble domain in said section of said medium in the presence of an in-plane field being applied to said magnetic layer associated with said section at a velocity sufficient to cause magnetic orientation instability in the wall of said bubble domain whereby the wall state becomes $S=0$.

* * * * *